United States Patent
Lifton et al.

(10) Patent No.: US 7,098,570 B2
(45) Date of Patent: Aug. 29, 2006

(54) CHARGE SCREENING IN ELECTROSTATICALLY DRIVEN DEVICES

(75) Inventors: Victor A. Lifton, Bridgewater, NJ (US); Anatoli Olkhovets, Murray Hill, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 321 days.

(21) Appl. No.: 10/646,128

(22) Filed: Aug. 22, 2003

(65) Prior Publication Data

US 2005/0041915 A1    Feb. 24, 2005

(51) Int. Cl.
*H02N 1/00* (2006.01)
*G02B 26/10* (2006.01)
*G02B 26/08* (2006.01)

(52) U.S. Cl. .................. 310/309; 358/291; 358/225
(58) Field of Classification Search ............ 310/309; 385/18; 359/223–225, 290, 291, 872
See application file for complete search history.

(56) References Cited

U.S. PATENT DOCUMENTS

| | | | |
|---|---|---|---|
| 5,949,944 A | | 9/1999 | Minford et al. ............. 385/131 |
| 6,133,670 A | * | 10/2000 | Rodgers et al. ............. 310/309 |
| 6,231,413 B1 | * | 5/2001 | Tsukamoto ................. 445/24 |
| 6,912,336 B1 | * | 6/2005 | Ishii et al. ................ 385/18 |

* cited by examiner

*Primary Examiner*—Karl Tamai

(57) ABSTRACT

In an electrostatic driving structure for a MEMS device or other electrostatically-driven device, non-insulating material is disposed on or adjacent a gap on the surface of a dielectric between adjacent electrodes and is electrically coupled to a source of potential, so as to form an electrostatic shield which reduces the effect of mobile charges in the dielectric gap on the forces generated by the electrostatic driving structure. The shield is made of non-insulating material and may, for example, be formed by plating of metal or epitaxial deposition of silicon onto the electrode.

30 Claims, 4 Drawing Sheets

US 7,098,570 B2

CHARGE SCREENING IN ELECTROSTATICALLY DRIVEN DEVICES

BACKGROUND OF THE INVENTION

This invention relates to charge dissipation in electrostatically driven devices, such as micro-electro-mechanical systems ("MEMS") devices.

In a typical MEMS device, a movable structure that includes a conductive member is resiliently mounted to a substrate. Resilient mounting may be effected by, e.g., one or more micromachined springs, a membrane, a cantilever, or a torsional plate. The substrate includes a dielectric material having a surface upon which a plurality of electrodes are disposed. The electrodes disposed on the dielectric surface are spaced apart from each other, so that a gap of dielectric material exists on the surface. Applying a potential difference between the movable conductive member and one or more of the electrodes on the substrate surface produces an attractive electrostatic force urging the movable structure toward the electrodes. The substrate with its electrodes forms an electrostatic structure adapted to drive the movable structure electrostatically. The resilient mounting of the movable structure provides a restoring force.

In certain applications, the deflection of a MEMS device's movable structure ideally would be a unique function of the potentials of each of the fixed electrodes on the substrate surface and the movable conductive member. If it were, the device could be operated in an open-loop manner; application of predetermined constant voltages to the fixed electrodes with respect to the movable conductive member would produce forces on the movable structure causing it to assume a well-defined position and then remain at that position for as long as the predetermined constant voltages continued to be applied.

Real dielectrics are imperfect, and when voltages are applied to the fixed electrodes of a MEMS device, charges may move in or on the dielectric gap that separates the electrodes. Charges can move within the dielectric due to filling or emptying of charge traps in the dielectric, and mobile ions can migrate along the surface of the dielectric. The changing charge distribution resulting from such moving charges causes a time-dependent electrostatic force on the movable structure, whose position thus changes with time ("drifts") in response to the changing force, even if the voltages applied to the electrodes are held constant. Drift can be a problem in electrostatically driven devices.

One solution to drift problems would be to provide sensors responsive to the position of the movable structure and feedback electronics, and to adjust the voltages applied to the electrodes so as to maintain the movable structure in a desired position. However, such sensors and feedback electronics can be costly and bulky, and can dissipate far more power than the MEMS device.

Another solution to drift problems arising from mobile charges in the dielectric of certain electrostatically driven devices has been to deposit or grow a thin conductive layer, referred to as a charge-dissipation layer, on top of the dielectric to bleed off surface charge from the dielectric. For instance, U.S. Pat. No. 5,949,944 describes such a charge dissipation layer for LiNbO₃ modulators, which like MEMS devices are electrostatically driven and may experience problems due to accumulation of surface charges. Forming a charge dissipation layer may require processing steps that might preferably be avoided; moreover, the electrical properties of charge dissipation layers may be difficult to control, and may change due to oxidation or corrosion.

SUMMARY OF THE INVENTION

Problems of the prior art are addressed by a non-insulating structure, disposed on an electrostatic structure on or adjacent a dielectric gap between adjacent electrodes and electrically coupled to an electrode or another source of potential, so as to form an electrostatic shield that reduces the effect of mobile charges in the dielectric gap on the forces generated by the electrostatic structure.

DETAILED DESCRIPTION

Figure 1:
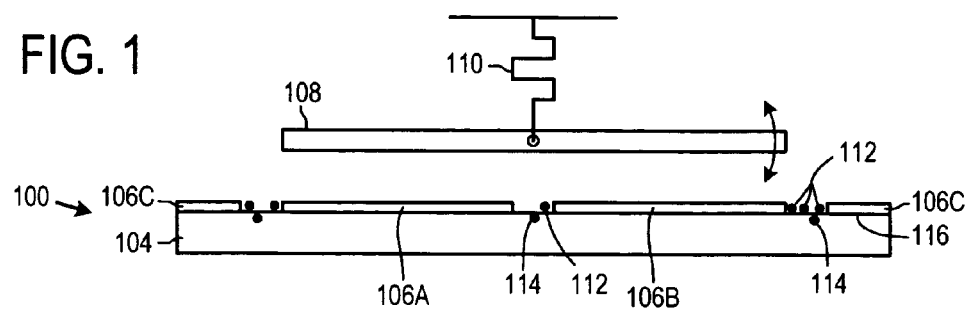
FIG. 1 is a schematic diagram illustrating the elements of a MEMS device in which the invention may be employed.

FIG. 1 is a schematic diagram illustrating the elements of an electrostatically driven device in which the invention may be employed. The device illustrated is an optical MEMS device, sometimes referred to as a micro-opto-electro-mechanical systems ("MOEMS") device, in which movement of the movable structure affects the optical properties of the device. The MOEMS device of FIG. 1 includes electrostatic driving structure 100 and movable structure 108. Movable structure 108 is disposed adjacent to, and movable with respect to, electrostatic driving structure 100.

Electrostatic driving structure 100 includes a plurality of conductive electrodes, such as metal or polysilicon electrodes, which are formed upon and supported by surface 116 of dielectric 104. Illustrated are electrodes 106A and 106B, which may function as driving electrodes, and electrode 106C, which may surround electrodes 106A and 106B and be grounded to provide shielding. Electrodes 106A, 106B, and 106C may be referred to collectively as electrodes 106.

Movable structure 108 includes a conductive reflector, such as a conductive silicon micromirror, and is supported by a resilient mounting structure 110, such as micromachined springs, adjacent electrodes 106. Movable structure 108 is illustrated as pivotably mounted. Applying a potential difference between the conductive reflector of movable structure 108 and an electrode 106 tilts movable structure 108 towards the energized electrode. If a light beam is directed at the conductive reflector, varying the tilt angle of movable structure 108 varies the angle of the reflected beam, and devices such as that of FIG. 1 may be used in beam-directing applications such as optical cross-connects.

Dielectric 104 insulates electrodes 106 from each other and from other device components. Common dielectric materials used in MEMS devices include silicon oxide and silicon nitride, which are good insulators and are commonly used dielectrics in the integrated circuit manufacturing industry. Typically movable structure 108 and resilient mounting structure 110 are fabricated on one wafer, the electrostatic driving structure 100 (including dielectric 104 and electrodes 106) is fabricated on another wafer, and then the wafers (or parts thereof) are secured together to form completed devices. Alternatively, for example, movable structure 108, resilient mounting structure 110, and electrostatic driving structure 100 might be fabricated in a monolithic device using surface micromachining.

As indicated above, dielectric 104 may contain electron or hole charge traps, as well as mobile ions on surface 116. Charge can slowly build up on or in dielectric 104 when electrodes 106 are biased and an electric field is imposed across dielectric 104. Such charge can include mobile surface charges 112 and mobile charges 114 within dielectric 104 that move into or out of charge traps in response to applied electric fields.

The potential difference between electrodes 106 can be changed in a very short time, e.g., much less than 1 millisecond. However, the distribution of charges 112 and 114 may change relatively slowly. After a change in potential difference between electrodes 106 has been applied, the charge distribution on and/or in dielectric 104 in the gaps between adjacent electrodes 106 might continuously change with a time constant ranging from seconds to many days, even though the potential on electrodes 106 remains fixed. As indicated above, such slowly changing distribution of charges 112 and/or 114 on or in dielectric 104 in the gaps between adjacent electrodes 106 exerts a slowly changing electrostatic force on movable structure 108, which then slowly drifts from its initial position as set by the potentials of electrodes 106.

In accordance with some embodiments of the invention, in an electrostatic driving structure having a plurality of electrodes disposed on the surface of a dielectric, a non-insulating structure is formed on and electrically coupled to an electrode adjacent a gap on the dielectric surface between the electrode and another electrode. The non-insulating structure forms an electrostatic shield which reduces the effect of mobile charges in the gap on the forces generated by the electrostatic driving structure.

Figure 2:
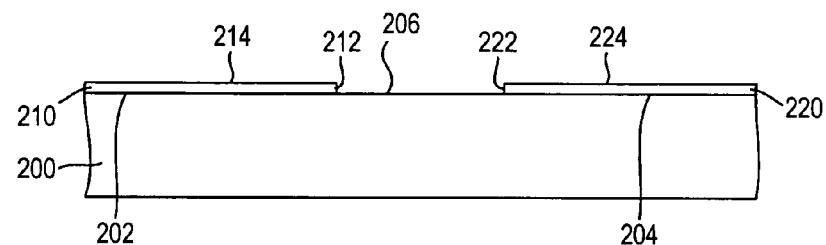
FIG. 2 is a schematic diagram illustrating a portion of an electrostatic device prior to formation of electrostatic shields.

FIGS. 2–6 are schematic diagrams illustrating successive steps in the formation of an electrostatic shield in accordance with an embodiment of the invention. FIG. 2 is a schematic diagram illustrating a portion of an electrostatic device prior to formation of electrostatic shields. The device of FIG. 2 might, for example, be a portion of an electrostatic driving structure for use in a MEMS device like that of FIG. 1. The electrostatic device includes a dielectric 200 which may be, or may be a part of, a substrate providing mechanical support for the device. Dielectric 200 includes a surface, which typically is generally planar. A first electrode 210 having a surface 214 is disposed on dielectric 200 in a first area 202 of the dielectric surface, and a second electrode 220 having a surface 224 is disposed on dielectric 200 in a second area 204 of the dielectric surface. Electrodes 210 and 220 are spaced apart to electrically isolate them, and their spaced-apart disposition defines a gap area 206 of dielectric 200 extending laterally between edge 212 of first electrode 210 and edge 222 of second electrode 220. Electrodes 210 and 220 are typically made of metal and may, for example, be formed on dielectric 200 by vapor deposition, but they may also be made of other materials, such as doped semiconductors, and may be formed on dielectric 200 by any process suitable for disposing the electrode material on the dielectric material. Mobile charges may exist on or in dielectric 200 in gap 206, and it may be desirable to screen such charges to reduce their effect on the forces generated by the device.

Figure 3:
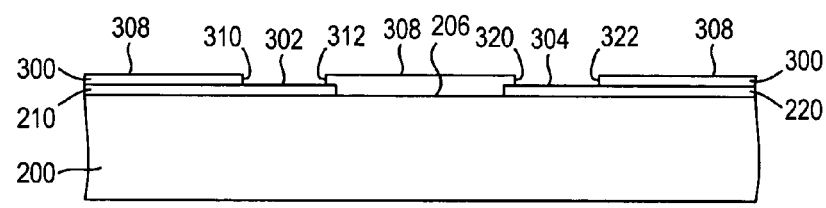
FIG. 3 is a schematic diagram illustrating an electrostatic device having shape-controlling structures in accordance with an embodiment of the invention.

FIG. 3 is a schematic diagram illustrating an electrostatic device having shape-controlling structures in accordance with an embodiment of the invention. The shape-controlling structure is disposed on the electrostatic device so as to cover certain portions of the surface and to leave other portions exposed. In FIG. 3, shape-controlling structure 300 is disposed on surface 214 of first electrode 210, surface 224 of second electrode 220, and gap 206. Shape-controlling structure 300 leaves an area 302 exposed on first electrode 210 adjacent gap 206, and leaves an area 304 exposed on second electrode 220 adjacent gap 206. Shape-controlling structure 300 may, for example, be a photoresist layer that is spun onto the surface of the device and patterned by lithography to define openings in upper surface 308 to expose area 302 and area 304. Shape-controlling structure 300 may also, for example, be a layer of silicon oxide, silicon nitride, polysilicon, polyimide, SU-8, or other masking material used in semiconductor device fabrication. The foregoing materials for shape-controlling structure 300 may be referred to herein as "resist." The opening in shape-controlling structure 300 which exposes area 302 is bounded laterally by edges 310 and 312, and the opening in shape-controlling structure 300 which exposes area 304 is bounded laterally by edges 320 and 322.

Figure 4:
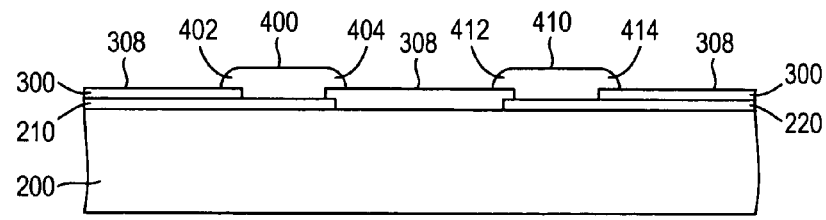
FIG. 4 is a schematic diagram illustrating an electrostatic device having electrostatic shields formed in accordance with an embodiment of the invention.

FIG. 4 is a schematic diagram illustrating an electrostatic device having electrostatic shields formed in accordance with an embodiment of the invention. Shields 400 and 410 are formed of a non-insulating material, for instance, aluminum, silver, gold, nickel, or other metal. If made of metal, shields 400 and 410 may be formed on electrodes 210 and 220 by electroplating, electroless plating, or other conventional metal deposition processes. Prior to forming the shields, preparatory steps, such as cleaning and/or applying a seed layer to exposed areas 302 and 304, may be desirable depending on the materials and process being used. For instance, prior to forming a shield on an aluminum electrode, it may be desirable to clean oxide from the aluminum surface, and prior to forming a shield of non-noble metal, it may be desirable to apply a seed layer of a material such as of zinc, copper, or palladium.

As material is deposited to form shields 400 and 410, the shape of the structure formed is controlled by shape-controlling structure 300. Initially, as material is deposited on area 302, the material is confined to the region between edges 310 and 312 of shape-controlling structure 300, and as material is deposited on area 304, the material is confined to the region between edges 320 and 322. The deposited material forms structures extending from first electrode 210 and second electrode 220 in a direction away from the surface of dielectric 200. After the thickness of the deposited material exceeds the thickness of shape-controlling structure 300 adjacent the openings, the deposited material rises above the level of the upper surface 308 of shape-controlling structure 300, and is not constrained by edges 310 and 312 or by edges 320 and 322. In addition to extending in a direction away from the surface of dielectric 200, the structures being formed also begin to extend laterally along and above upper surface 308 of shape-controlling structure 300. Thus, as shown in FIG. 4, shields 400 and 410 have developed a "mushroom" shape, and include laterally-extending portions 402, 404, 412, and 414.

Figure 5:
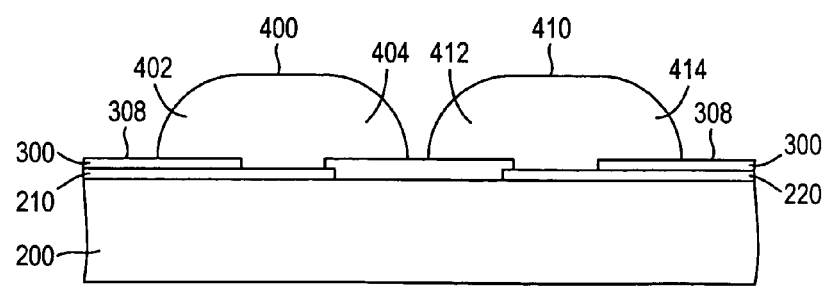
FIG. 5 is a schematic diagram illustrating the electrostatic device of FIG. 4 after further deposition of non-insulating material on the electrostatic shields.

FIG. 5 is another schematic diagram illustrating the device of FIG. 4 after further non-insulating material has been deposited on shields 400 and 410. The lateral extent of shields 400 and 410 has increased so that laterally-extending portion 404 is adjacent laterally-extending portion 412.

Figure 6:
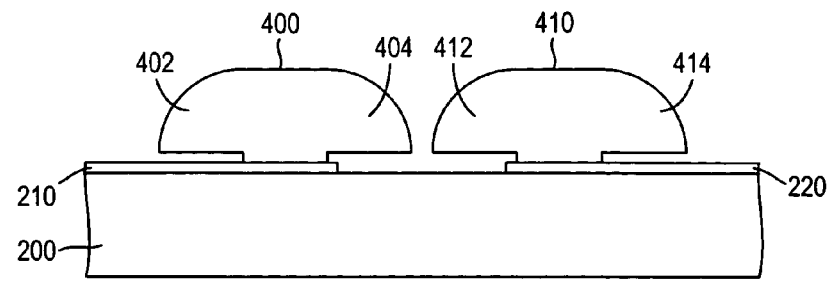
FIG. 6 is a schematic diagram illustrating the device of FIG. 5 after removal of the shape-controlling structures.

Shape-controlling structure 300 is removed by resist-stripping techniques appropriate for the particular resist used to form it. FIG. 6 is a schematic diagram illustrating the device of FIG. 5 after removal of shape-controlling structure 300. Laterally-extending portion 404 and laterally-extending portion 412 overhang gap 206 so that mobile charges in or on dielectric 200 in gap 206 are screened and the effect of such mobile charges on the forces generated by the electrostatic driving structure is reduced. Because of the substantial overhang, bringing laterally-extending portion 404 closely adjacent laterally-extending portion 412, the effect of such mobile charges is substantially reduced.

If the shape-controlling structure 300 were removed from the device illustrated in FIG. 4, shields 400 and 410 would provide some screening of mobile charges in gap 206. However, because the lateral and vertical dimensions of shields 400 and 410 are smaller in FIG. 4 than in FIG. 5 with respect to the lateral extent of gap 206, the degree of screening and the effectiveness as electrostatic shields of shields 400 and 410 is less in FIG. 4 than in FIG. 5.

Figure 7:
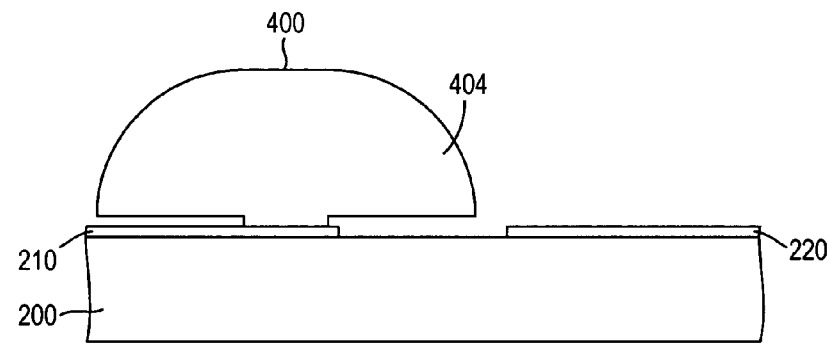
FIG. 7 is a schematic diagram illustrating an electrostatic device in accordance with another embodiment of the invention.

FIG. 7 is a schematic diagram illustrating an electrostatic device in accordance with another embodiment of the invention. Whereas the structure formed as described with respect to FIGS. 2–6 includes an electrostatic shield formed on each of an adjacent pair of electrodes, the structure illustrated in FIG. 7 is formed when an electrostatic shield is formed on only one electrode of an adjacent pair of electrodes. If shape-controlling structure 300 of FIGS. 3–7 covered area 304 of second electrode 220, and a non-insulating material were deposited in the manner described above to form first electrode 210, a structure like that shown in FIG. 7 would result. As shown, the lateral extent of laterally-extending portion 404 is sufficient to substantially overhang the entire width of gap 206, thereby substantially reducing the effect of mobile charges in gap 206 on the forces generated by the electrostatic driving structure. A shield 400 of smaller lateral dimension with respect to the lateral extent of gap 206 than that shown in FIG. 7 would provide a lesser degree of screening and effectiveness as an electrostatic shield.

In the structures shown in FIGS. 6 and 7, generally there is a tradeoff between the degree of screening and other factors. For instance, forming a shield or shields with greater lateral extent will generally provide more effective screening of mobile charges in dielectric between electrodes, but requires more material, and increases the possibility of low-impedance paths between electrodes.

Figure 8:
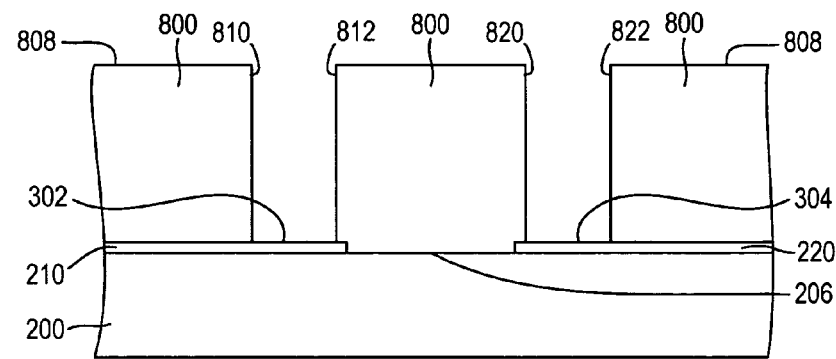
FIG. 8 is a schematic diagram illustrating an electrostatic device having shape-controlling structures in accordance with another embodiment of the invention.
Figure 9:
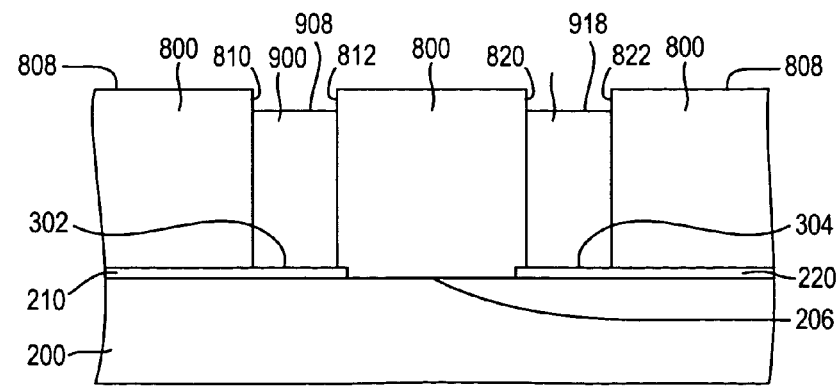
FIG. 9 is a schematic diagram illustrating the device of FIG. 8 having electrostatic shields formed in accordance with an embodiment of the invention.
Figure 10:
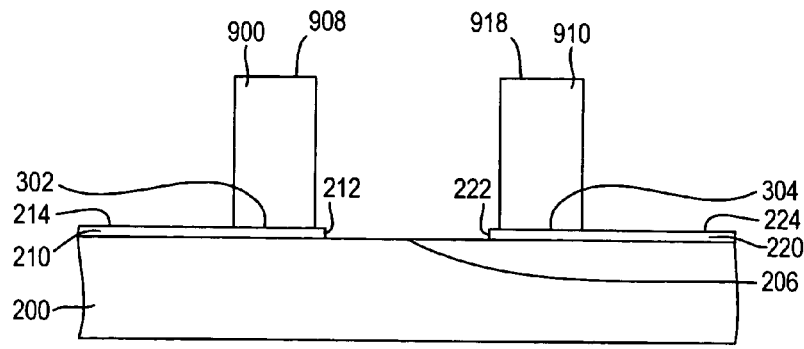
FIG. 10 is a schematic diagram illustrating the device of FIG. 9 after removal of the shape-controlling structures.

FIGS. 8–10 are schematic diagrams illustrating successive steps in the formation, upon a device as illustrated in FIG. 2, of an electrostatic shield in accordance with another embodiment of the invention. FIG. 8 is a schematic diagram illustrating an electrostatic device having shape-controlling structures in accordance with this embodiment. Shape-controlling structure 800 leaves area 302 exposed on first electrode 210 adjacent gap 206 and leaves area 304 exposed on second electrode 220 adjacent gap 206, as does shape-controlling structure 300 of FIG. 3, and likewise may, for example, be a resist layer that is spun onto the surface of the device and patterned by lithography to define openings in upper surface 808 to expose area 302 and area 304. The opening in shape-controlling structure 800 which exposes area 302 is bounded laterally by edges 810 and 812, and the opening in shape-controlling structure 800 which exposes area 304 is bounded laterally by edges 820 and 822. One difference between the shape-controlling structures of FIGS. 3 and 8 is that the vertical extent of shape-controlling structure 800 with respect to the lateral extent of gap 206 is greater than that of shape-controlling structure 300.

FIG. 9 is a schematic diagram illustrating an electrostatic device having electrostatic shields formed in accordance with this embodiment of the invention. Shields 900 and 910 are formed of a non-insulating material, and may be made of the materials and formed by the processes described with respect to shields 400 and 410.

As material is deposited to form shields 900 and 910, the shape of the structure formed is controlled by shape-controlling structure 900. In the embodiment of FIGS. 8–10, deposition of non-insulating material is stopped before surfaces 908 and 918 of shields 900 and 910 reach the level of upper surface 808 of shape-controlling structure 800. The material is confined to the region between edges 810 and 812 and the region between edges 820 and 822 of shape-controlling structure 800, and forms structures extending from first electrode 210 and second electrode 220 in a direction away from the surface of dielectric 200.

FIG. 10 is a schematic diagram illustrating the device of FIG. 9 after removal of shape-controlling structure 800. Although shields 900 and 910 lack laterally-extending portions overhanging gap 206, mobile charges in or on dielectric 200 in gap 206 are screened and the effect of such mobile charges on the forces generated by the electrostatic driving structure is reduced. If shields 900 and 910 have a sufficient vertical extent with respect to the lateral extent of gap 206, the effect of such mobile charges may be substantially reduced. For example, in certain applications, shields 900 and 910 may provide a substantial reduction in the effect of mobile charges in gap 206 if the vertical extent of shields 900 and 910, in a direction normal to surfaces 214 and 224, is about the lateral extent of gap 206. Preferably, shields 900 and 910 are disposed close to edges 212 and 222, respectively.

An electrostatic driving structure may be made like that of FIG. 10 but including only one of the shields adjacent gap 206. The reduction in mobile charge screening effectiveness due to omission of one of the shields may be acceptable in certain applications, or might be compensated by other factors such as the vertical extent of the shield that is present or the disposition of the movable structure with respect to gap 206.

In the embodiments of FIGS. 3–10, the electrostatic shield is not disposed on the dielectric material in the gap. In other embodiments, the electrostatic shield is disposed on the dielectric material in the gap. Several such embodiments are shown in FIGS. 11–18.

Figure 11:
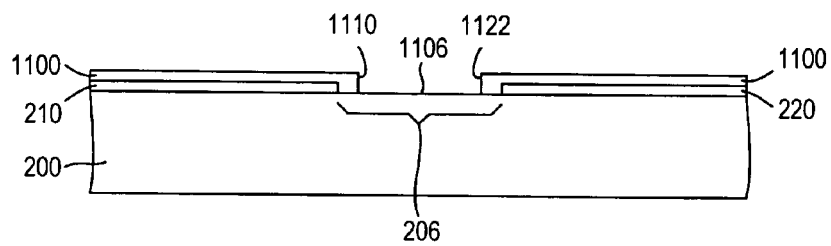
FIG. 11 is a schematic diagram illustrating an electrostatic device having shape-controlling structures in accordance with another embodiment of the invention.

FIG. 11 is a schematic diagram illustrating an electrostatic device having a shape-controlling structure in accordance with another embodiment of the invention. The shape-controlling structure is disposed on the electrostatic device of FIG. 2 so as to cover certain portions of the surface and to leave other portions exposed. In FIG. 11, shape-controlling structure 1100 leaves an area 1106 exposed on the dielectric material in gap 206, and masks first electrode 210 and second electrode 220 adjacent gap 206. The opening in shape-controlling structure 1100 which exposes area 1106 is bounded laterally by edges 1110 and 1122.

Figure 12:
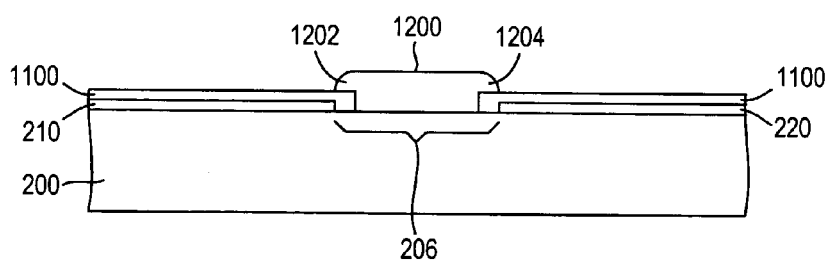
FIG. 12 is a schematic diagram illustrating the device of FIG. 11 having an electrostatic shield formed in accordance with an embodiment of the invention.

FIG. 12 is a schematic diagram illustrating the device of FIG. 11 having an electrostatic shield formed in accordance with an embodiment of the invention. Shield 1200 is formed of a non-insulating material, of a type and in a manner as previously described. As material is deposited to form shield 1200, the shape of the structure formed is controlled by shape-controlling structure 1100. Initially, as material is deposited on area 1106, the material is confined to the region between edges 1110 and 1122 of shape-controlling structure 1100. After the thickness of the deposited material exceeds the thickness of shape-controlling structure 1100 adjacent the opening, the deposited material rises above the level of the upper surface of shape-controlling structure 1100, and is not constrained by edges 1110 and 1122. Thus, as shown in FIG. 12, shield 1200 has developed a "mushroom" shape, and includes laterally-extending portions 1202 and 1204.

Figure 13:
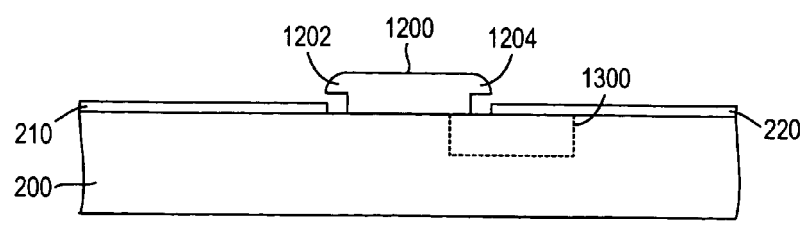
FIG. 13 is a schematic diagram illustrating the device of FIG. 12 after removal of the shape-controlling structures.

FIG. 13 is a schematic diagram illustrating the device of FIG. 12 after removal of the shape-controlling structure. Because shield 1200 is not deposited directly on an electrode, the inherent coupling to a source of potential resulting from such a structure does not exist in the device of FIG. 13. Dotted line 1300 illustrates an electrical connection between shield 1200 and second electrode 220 to drive shield 1200 at the potential of second electrode 220. The lateral extent of laterally-extending portions 1202 and 1204 is such as to substantially screen mobile charges in gap 206. Alternatively, deposition of non-insulating material could be terminated before its thickness exceeds that of shape-controlling structure 1100, with the omission of laterally-extending portions 1202 and 1204 and some reduction in the degree of screening provided by shield 1200.

Figure 14:
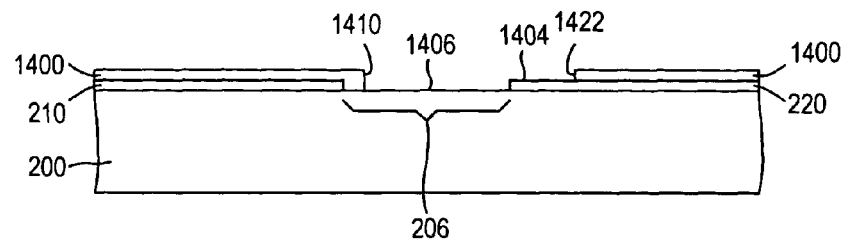
FIG. 14 is a schematic diagram illustrating an electrostatic device having shape-controlling structures in accordance with another embodiment of the invention.

FIG. 14 is a schematic diagram illustrating an electrostatic device having a shape-controlling structure in accordance with another embodiment of the invention. The shape-controlling structure is disposed on the electrostatic device of FIG. 2 so as to cover certain portions of the surface and to leave other portions exposed. In FIG. 14, shape-controlling structure 1400 leaves an area 1406 exposed on the dielectric material in gap 206, and masks first electrode 210 and part, but not all, of second electrode 220 adjacent gap 206. That is, shape-controlling structure 1400 leaves an area 1404 of second electrode 220 adjacent gap 206 exposed. The opening in shape-controlling structure 1400 which exposes area 1406 and area 1404 is bounded laterally by edges 1410 and 1422.

Figure 15:
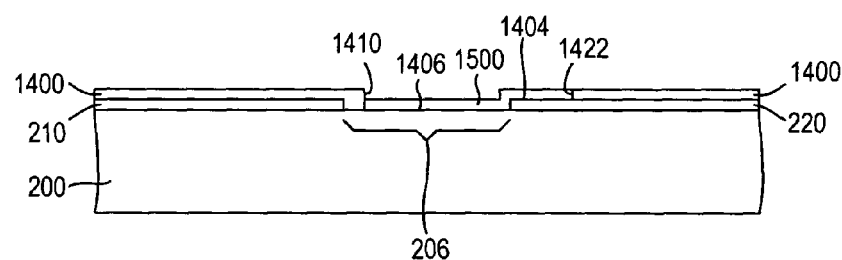
FIG. 15 is a schematic diagram illustrating the device of FIG. 14 having an electrostatic shield formed in accordance with an embodiment of the invention.
Figure 16:
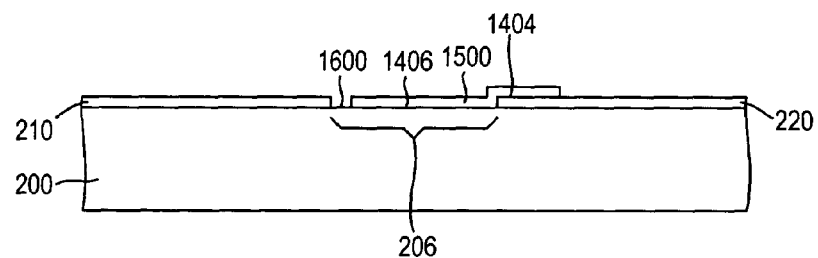
FIG. 16 is a schematic diagram illustrating the device of FIG. 15 after removal of the shape-controlling structures.

FIG. 15 is a schematic diagram illustrating the device of FIG. 14 having an electrostatic shield formed in accordance with an embodiment of the invention. Shield 1500 is formed of a non-insulating material, of a type and in a manner as previously described. As material is deposited to form shield 1500, the shape of the structure formed is controlled by shape-controlling structure 1400. Initially, as material is deposited on areas 1404 and 1406, the material is confined to the region between edges 1410 and 1422 of shape-controlling structure 1400. FIG. 16 is a schematic diagram illustrating the device of FIG. 15 after removal of the shape-controlling structure. Because shield 1500 is deposited on and in contact with second electrode 220, it does not need separate coupling to it or to some source of potential, as does the device of FIG. 13. Because shield 1500 is continuous across the boundary between gap 206 and second electrode 220, only a small area 1600 of dielectric material in gap 206 is unscreened. Leaving such an area is preferred in order to avoid a conduction path through non-insulating material between first electrode 210 and second electrode 220.

Figure 17:
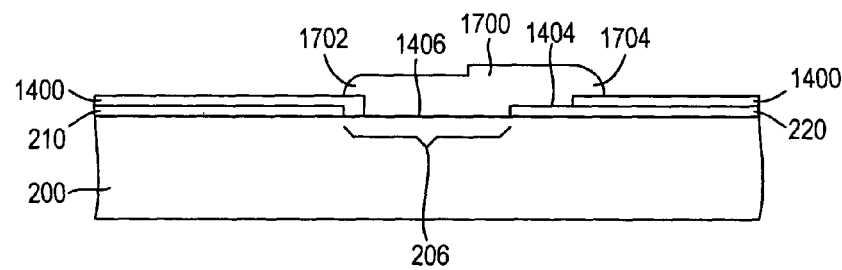
FIG. 17 is a schematic diagram illustrating the electrostatic device of FIG. 15 after further deposition of non-insulating material on the electrostatic shield.
Figure 18:
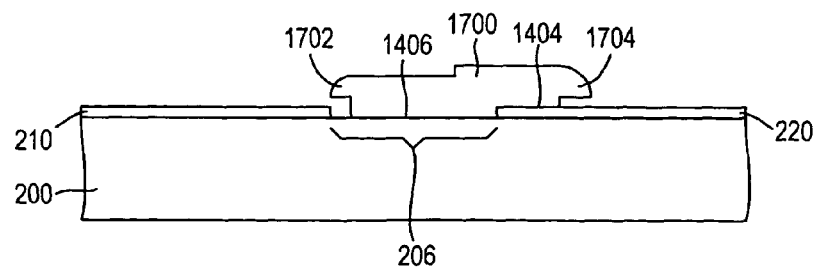
FIG. 18 is a schematic diagram illustrating the device of FIG. 17 after removal of the shape-controlling structures.

The effect of mobile charges in area 1600 can be reduced by a laterally-extending portion of shield 1500, and formation of an electrostatic shield with such a laterally-extending portion is shown in FIGS. 17 and 18. FIG. 17 is another schematic diagram illustrating the device of FIG. 15 after further non-insulating material has been deposited on shield 1500. After the thickness of the deposited material exceeds the thickness of shape-controlling structure 1400 adjacent the opening, the deposited material rises above the level of the upper surface 308 of shape-controlling structure 1400, and is not constrained by edges 1410 and 1422. In addition to extending in a direction away from the surface of dielectric 200, the structure being formed also begins to extend laterally along and above the upper surface of shape-controlling structure 1400. Thus, as shown in FIG. 17, shield 1700 has developed a "mushroom" shape, and includes laterally-extending portions 1702, which screens mobile charges in area 1600, and 1704.

Electrostatic shields in accordance with the invention may also be made, for instance, of silicon deposited by epitaxy on a silicon oxide shape-controlling structure. The silicon deposition conditions can be controlled to make the deposited material somewhat conductive, but even intrinsic silicon may be sufficiently conductive for use in an electrostatic shield to screen mobile charges. Accordingly, the materials from which an electrostatic shield may be formed are referred to herein as non-insulating rather than as conductive.

Although the invention has been described in part with respect to electrostatic driving structures for driving a rotatable movable structure, such as may be used in an optical cross-connect, it should be understood that it may be applied to devices having other movable structures, for instance, cantilevers and membranes, and used in other types of electrostatically-driven devices, such as paddle oscillators, comb drives, and modulators.

The elements shown in the drawing figures are not necessarily representative of the scale or relative dimensions of any device, and the drawing scale is selected for purposes of facilitating understanding of the invention. Some embodiments of optical cross-connects might have moving mirrors that are hundreds of micrometers in diameter and spaced tens of micrometers away from an electrostatic driving structure having one-micrometer thick electrodes spaced apart from each other by gaps that are several micrometers wide. Other embodiments of such devices, and embodiments of other electrostatically driven devices, may have substantially different dimensions and relative dimensions, which are usually dictated by factors such as the intended use and desired specifications of a device. The dimensions of electrostatic shields relative to gap width, and the degree of screening they provide, may be constrained in some applications by other factors in the design of a particular device.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A method for use in making an electrostatic driving structure for an electrostatically driven device, the electrostatic driving structure having a first electrode in a first area of a surface of a dielectric and a second electrode in a second area of the surface of the dielectric that is spaced apart from the first area so as to define a gap on the dielectric surface between the first electrode and the second electrode, the method comprising:
   disposing a first electrostatic shield made of non-insulating material on the electrostatic driving structure adjacent the gap, wherein the first electrostatic shield includes (i) a portion disposed on the first electrode adjacent the gap and (ii) a portion disposed on the dielectric material in the gap; and
   electrically coupling the first electrostatic shield to a source of potential.

2. The invention of claim 1, further comprising disposing a second electrostatic shield made of non-insulating material on the electrostatic driving structure adjacent the gap and electrically coupling the second electrostatic shield to a source of potential.

3. The invention of claim 1, wherein the first electrostatic shield is made of metal or a semiconductor.

4. The invention of claim 3, wherein the first electrostatic shield is disposed on the electrostatic driving structure by electroplating, electroless plating or vapor deposition.

5. The invention of claim 1, further comprising disposing a shape-controlling structure on the electrostatic driving structure prior to disposing the first electrostatic shield, so that the shape of the first electrostatic shield formed is controlled by the shape of the shape-controlling structure.

6. The invention of claim 5, wherein the shape-controlling structure comprises a layer of material disposed on the electrodes and the gap, having an opening in the layer exposing an area of the electrostatic driving structure.

7. The invention of claim 6, wherein disposing the first electrostatic shield comprises disposing non-insulating material on the exposed area of the electrostatic driving structure to a thickness less than the thickness of the shape-controlling structure adjacent the opening, and then removing the shape-controlling structure.

8. The invention of claim 6, wherein disposing the first electrostatic shield comprises disposing non-insulating material on the exposed area of the electrostatic driving structure to a thickness greater than the thickness of the shape-controlling structure adjacent the opening, and then removing the shape-controlling structure.

9. The invention of claim 5, wherein the shape-controlling structure comprises a layer of resist.

10. The invention of claim 1, wherein the source of potential is the first electrode.

11. The invention of claim 1, wherein the first electrostatic shield includes a portion extending away from the first electrode, in a direction normal to the surface of the first electrode, a distance that is at least about the lateral extent of the gap between the first electrode and the second electrode.

12. The invention of claim 1, wherein the first electrostatic shield includes a laterally extending portion that extends away from the first electrode, in a direction generally parallel to the surface of the first electrode, so as to overhang at least a part of the gap.

13. An electrostatically driven device including an electrostatic driving structure having a first electrode in a first area of a surface of a dielectric and a second electrode in a second area of the surface of the dielectric that is spaced apart from the first area so as to define a gap on the dielectric surface between the first electrode and the second electrode, further comprising a first electrostatic shield, the first electrostatic shield being made of non-insulating material, disposed on the electrostatic driving structure adjacent the gap, and electrically coupled to a source of potential, wherein the first electrostatic shield includes (i) a portion disposed on the first electrode adjacent the gap and (ii) a portion disposed on the dielectric material in the gap.

14. The invention of claim 13, wherein the source of potential is the first electrode.

15. The invention of claim 13, further comprising a second electrostatic shield that is made of non-insulating material, disposed on the electrostatic driving structure adjacent the gap, and electrically coupled to a source of potential.

16. The invention of claim 15, wherein the source of potential is the second electrode.

17. The invention of claim 13, wherein the first electrostatic shield is made of metal or a semiconductor.

18. The invention of claim 13, wherein the first electrostatic shield includes a portion extending away from the first electrode, in a direction normal to the surface of the first electrode, a distance that is at least about the lateral extent of the gap between the first electrode and the second electrode.

19. The invention of claim 13, wherein the first electrostatic shield includes a laterally extending portion that extends away from the first electrode, in a direction generally parallel to the surface of the first electrode, so as to overhang at least a part of the gap.

20. The invention of claim 13, wherein the cross-section of the first electrostatic shield is generally rectangular.

21. The invention of claim 13, wherein the cross-section of the first electrostatic shield is generally mushroom-shaped.

22. An electrostatic shield made of non-insulating material coupled to a first electrode on the surface of a dielectric material, the first electrode being separated from a second electrode on the surface of the dielectric material by a gap, wherein the first electrostatic shield includes (i) a portion disposed on the first electrode adjacent the gap and (ii) a portion disposed on the dielectric material in the gap.

23. An electrostatically driven device having means for electrostatically driving a moveable member, the electrostatic driving means comprising:
   first electrode means disposed in a first area of a surface of a dielectric;
   second electrode means disposed in a second area of the surface of the dielectric that is spaced apart from the first area so as to define a gap on the dielectric surface between the first electrode means and the second electrode means; and
   electrostatic shield means for reducing the effect on the moveable member of mobile charges on or in the gap, the electrostatic shield means being made of non-insulating material, disposed on the electrostatic driving structure adjacent the gap, and electrically coupled to a source of potential, wherein the electrostatic shield means includes (i) a portion disposed on the first electrode means adjacent the gap and (ii) a portion disposed on the dielectric in the gap.

24. A method for use in making an electrostatic driving structure for an electrostatically driven device, the electrostatic driving structure having a first electrode in a first area of a surface of a dielectric and a second electrode in a second area of the surface of the dielectric that is spaced apart from the first area so as to define a gap on the dielectric surface between the first electrode and the second electrode, the method comprising:
   disposing a first electrostatic shield made of non-insulating material on the electrostatic driving structure adjacent the gap, wherein the first electrostatic shield includes (i) a portion disposed on the first electrode adjacent the gap and (ii) a laterally extending portion that extends away from the first electrode, in a direction generally parallel to the surface of the first electrode, so as to overhang at least a part of the gap; and
   electrically coupling the first electrostatic shield to a source of potential.

25. The invention of claim 24, wherein substantially the entire gap is overhung by laterally extending portions of one or more electrostatic shields.

26. An electrostatically driven device including an electrostatic driving structure having a first electrode in a first area of a surface of a dielectric and a second electrode in a second area of the surface of the dielectric that is spaced apart from the first area so as to define a gap on the dielectric surface between the first electrode and the second electrode, further comprising a first electrostatic shield, the first electrostatic shield being made of non-insulating material, disposed on the electrostatic driving structure adjacent the gap, and electrically coupled to a source of potential, wherein the first electrostatic shield includes (i) a portion disposed on the first electrode adjacent the gap and (ii) a laterally extending portion that extends away from the first electrode, in a direction generally parallel to the surface of the first electrode, so as to overhang at least a part of the gap.

27. The invention of claim 26, wherein substantially the entire gap is overhung by laterally extending portions of one or more electrostatic shields.

28. An electrostatically driven device including an electrostatic driving structure having a first electrode in a first area of a surface of a dielectric and a second electrode in a second area of the surface of the dielectric that is spaced apart from the first area so as to define a gap on the dielectric surface between the first electrode and the second electrode, further comprising a first electrostatic shield, the first electrostatic shield being made of non-insulating material, disposed on the electrostatic driving structure adjacent the gap, and electrically coupled to a source of potential, wherein the cross-section of the first electrostatic shield is generally mushroom-shaped.

29. A method for use in making an electrostatic driving structure for an electrostatically driven device, the electrostatic driving structure having a first electrode in a first area of a surface of a dielectric and a second electrode in a second area of the surface of the dielectric that is spaced apart from the first area so as to define a gap on the dielectric surface between the first electrode and the second electrode, the method comprising:
   disposing a first electrostatic shield made of non-insulating material on the electrostatic driving structure adjacent the gap;
   electrically coupling the first electrostatic shield to a source of potential; and
   disposing a shape-controlling structure on the electrostatic driving structure prior to disposing the first electrostatic shield, so that the shape of the first electrostatic shield formed is controlled by the shape of the shape-controlling structure, wherein:
      the shape-controlling structure comprises a layer of material disposed on the electrodes and the gap, having an opening in the layer exposing an area of the electrostatic driving structure; and
      disposing the first electrostatic shield comprises disposing non-insulating material on the exposed area of the electrostatic driving structure to a thickness greater than the thickness of the shape-controlling structure adjacent the opening, and then removing the shape-controlling structure.

30. The invention of claim 29, wherein the cross-section of the first electrostatic shield is generally mushroom-shaped.

* * * * *